United States Patent [19]

Robeck et al.

[11] Patent Number: 5,266,232
[45] Date of Patent: Nov. 30, 1993

[54] AZEOTROPE-LIKE MIXTURE OF METHANOL AND 1H-PERFLUOROHEXANE

[75] Inventors: Horst Robeck; Hans-Matthias Deger, both of Hofheim am Taunus, Fed. Rep. of Germany

[73] Assignee: Hoechst Aktiengesellschaft, Frankfurt, Fed. Rep. of Germany

[21] Appl. No.: 900,914

[22] Filed: Jun. 18, 1992

[30] Foreign Application Priority Data

Jun. 21, 1991 [DE] Fed. Rep. of Germany ....... 4120506

[51] Int. Cl.$^5$ .......................... C11D 7/30; C11D 7/50; C23G 5/028
[52] U.S. Cl. ........................................ 252/171; 134/12; 134/31; 134/38; 134/40; 134/42; 252/162; 252/170; 252/364; 252/DIG. 9
[58] Field of Search ............... 252/162, 170, 171, 364, 252/DIG. 9; 134/12, 31, 38, 40, 42

[56] References Cited

U.S. PATENT DOCUMENTS

| | | | |
|---|---|---|---|
| 3,960,746 | 6/1976 | Gorski | 252/171 |
| 5,055,138 | 10/1991 | Slinn | 134/11 |
| 5,059,728 | 10/1991 | Li et al. | 570/134 |
| 5,064,559 | 11/1991 | Merchant | 252/171 |
| 5,073,291 | 12/1991 | Robeck et al. | 252/171 |
| 5,100,572 | 3/1992 | Merchant | 252/171 |

FOREIGN PATENT DOCUMENTS

| | | |
|---|---|---|
| 431458 | 6/1991 | European Pat. Off. . |
| 0431458 | 6/1991 | European Pat. Off. . |
| 432672 | 6/1991 | European Pat. Off. . |
| 0445438 | 9/1991 | European Pat. Off. . |
| 450308 | 10/1991 | European Pat. Off. . |
| 0516029 | 12/1992 | European Pat. Off. . |
| 3-252500 | 11/1991 | Japan . |
| 1026003 | 4/1966 | United Kingdom . |
| 1399867 | 7/1975 | United Kingdom . |

OTHER PUBLICATIONS

European Search Report Dated Mar. 16, 1993.
European Patent Office, Database WPIL, Derwent Printout An 91-374103 & JP-A-3 252 500, Nov. 1991.

*Primary Examiner*—Linda Skaling
*Attorney, Agent, or Firm*—Connolly and Hutz

[57] ABSTRACT

The invention relates to an azeotrope-like mixture which contains about 5-9% by weight of methanol and about 91-95% by weight of 1 H-perfluorohexane and to a process for cleaning electronic components, in particular soldered circuit boards or printed circuits, with the aid of this mixture.

6 Claims, No Drawings

AZEOTROPE-LIKE MIXTURE OF METHANOL AND 1H-PERFLUOROHEXANE

DESCRIPTION

It is state of the art to use mixtures of 1,1,2-trichloro-1,2,2-trifluoroethane (R 113) and alcohols such as methanol, ethanol or 2-propanol to clean soldered circuit boards and other electronic components (British Patents 1 026 003 and 1 399 867). U.S. Pat. No. 3,960,746 discloses an azeotrope-like mixture of R 113, methanol and nitromethane for the same purpose. Since, however, CFCs are suspected of damaging the ozone layer, it is necessary to dispense with this class of substances.

Various water-based systems and systems based on non-halogenated organic solvents are currently under discussion for the electronics industry sector, in particular for cleaning circuit boards after the soldering operation. However, it is difficult to find the correct surfactant/complex-forming agent combination in the case of aqueous cleaning agents. The system must also be adapted to the mechanical treatment, such as rinsing, brushing steam jet or ultrasonic treatment. Aqueous cleaning systems are frequently ruled out in the case of SMT (Surface Mount Technology), since the water can be removed again only with difficulty.

When non-halogenated organic solvents, such as petroleum spirit, alcohols, terpenes or esters, are used the installation must be of explosion-proof design because of the combustibility and the explosive nature of the substances and, therefore, on economic grounds use of said solvents in surface treatment installations is worth considering only in a few cases.

Azeotrope-like solvent mixtures of 1,4-dihydroperfluorobutane and methanol and, respectively, of 2,2,2-trifluoroethyl 1,1,2,2-tetrafluoroethyl ether and ethanol, which are suitable for cleaning electrical and electronic components, are described in German Patent Applications P 4 002 120.3 and P 4 013 369.9, which have not previously been published.

Surprisingly, it has now been found that 1H-perfluorohexane $CF_3-(CF_2)_4-CF_2H$ forms an azeotrope-like solvent mixture with methanol, which mixture is outstandingly suitable for cleaning electronic components, especially soldered circuit boards or printed circuits, in particular for removing soldering fluxes.

The invention relates to an azeotrope-like mixture which contains about 5-9% by weight of methanol and about 91-95% by weight of 1H-perfluorohexane. Preferably the mixture contains 6.5-8.0% by weight of methanol and in particular 7.0-7.8% by weight of methanol, the remainder being 1H-perfluorohexane in each case. The invention also relates to a process for cleaning electronic components, in particular soldered circuit boards or printed circuits, wherein the components are washed with an azeotrope-like mixture which contains about 5-9% by weight of methanol and 91-95% by weight of 1H-perfluorohexane. Preferably, a mixture which contains 6.5-8.0% by weight of methanol and in particular 7.0-7.8% by weight of methanol is used, the remainder being essentially 1H-perfluorohexane in each case.

A particularly preferred solvent mixture contains 92.6% by weight of 1H-perfluorohexane and 7.4% by weight of methanol and has a boiling point under 1 bar of 53.5° C.

In the case of the mixture, according to the invention, of methanol and 1H-perfluorohexane, the composition of the vapor is identical or substantially identical to the composition of the liquid, that is to say the composition of the mixture does not change or does not change substantially on vaporization. The solvent mixture according to the invention has the further advantage that it contains no chlorine and thus causes no ozone damage. Moreover, it is not combustible and can be used in the conventional ultrasonic, dip and brush wash installations.

EXAMPLE 1

A glass fiber-reinforced base material for circuit boards based on polyester was coated with a commercially available soldering flux (Zeva C 20-200 from Zevatron; main constituent colophony, with additional activators) and dried for 18 hours at 60° C. in an oven. The material was then washed with a mixture of 1H-perfluorohexane (92.6% by weight) and methanol (7.4% by weight) using ultrasound. The periods of action were 30-60 seconds; the flux was completely removed.

EXAMPLE 2

The procedure was as in Example 1 except that a different soldering flux was used (Zeva C 30-300 from Zevatron), which again contained colophony as the main constituent in addition to activators. After a period of action of 30-60 seconds, the flux was completely removed. In the case of the conventional mixtures of 1,1,2-trichloro-1,2,2-trifluoroethane with methanol, ethanol or 2-propanol, on the other hand, the treatment times are between 60 and 90 seconds, depending on the flux. Moreover, ionic residues can be better removed with the azeotrope than with the conventional mixtures.

EXAMPLE 3

Example 3 was carried out in the same way as Example 1 except that the flux used was GR8 flux from Ersa (main constituent colophony, with additional activators). After a period of action of 30-60 seconds the flux was completely removed.

We claim:

1. An azeotrope-like mixture consisting essentially of 5-9% by weight of methanol and 91-95% by weight of 1H-perfluorohexane, said mixture having a boiling point at 1 bar of about 53° C. and wherein the composition of said mixture does not substantially change upon evaporation.

2. The azeotrope-like mixture as claimed in claim 1, which consists essentially of 6.5-8.0% by weight of methanol and 92.0-93.5% by weight of 1H-perfluorohexane.

3. The azeotrope-like mixture as claimed in claim 1, which consists essentially of 7.0-7.8% by weight of methanol and 93.2-93.0% by weight of 1H-perfluorohexane.

4. A process for cleaning electronic components which comprises washing the components with an azeotrope-like mixture as claimed in claim 1.

5. A process for removing soldering fluxes, which comprises washing the soldering fluxes with an azeotrope-like mixture as claimed in claim 1.

6. The process as claimed in claim 4, wherein the electronic components are soldered circuit boards or printed circuits.

* * * * *